(12) United States Patent
Baba

(10) Patent No.: US 7,619,794 B2
(45) Date of Patent: Nov. 17, 2009

(54) HOLOGRAM-REPRODUCING METHOD AND HOLOGRAM-REPRODUCING DEVICE

(75) Inventor: Shigeyuki Baba, Tokyo (JP)

(73) Assignee: Sony Corporation, Tokyo (JP)

( * ) Notice: Subject to any disclaimer, the term of this patent is extended or adjusted under 35 U.S.C. 154(b) by 339 days.

(21) Appl. No.: 11/430,413

(22) Filed: May 9, 2006

(65) Prior Publication Data

US 2006/0256414 A1 Nov. 16, 2006

(30) Foreign Application Priority Data

May 11, 2005 (JP) ............................ 2005-138619
Jul. 7, 2005 (JP) ............................ 2005-198482

(51) Int. Cl.
*G03H 1/22* (2006.01)
*G03H 1/00* (2006.01)
*G03H 1/26* (2006.01)

(52) U.S. Cl. ................................ 359/32; 359/22; 359/1

(58) Field of Classification Search ....................... None
See application file for complete search history.

(56) References Cited

U.S. PATENT DOCUMENTS

2003/0007204 A1 * 1/2003 Ashizaki et al. ............... 359/23

FOREIGN PATENT DOCUMENTS

JP 2005233998 A * 9/2005

* cited by examiner

*Primary Examiner*—Stephone B Allen
*Assistant Examiner*—Jade R Callaway
(74) *Attorney, Agent, or Firm*—Frommer Lawrence & Haug LLP; William S. Frommer; Ellen Marcie Emas

(57) ABSTRACT

A hologram-reproducing method is adapted to obtain a reproduced image by irradiating a hologram-recording material with a reference-light beam so that a reproduction signal-light beam is generated and picking up an image of the reproduction signal-light beam. The hologram-reproducing method includes the steps of generating a plurality of reproduced images by irradiating the hologram-recording material with a plurality of reference-light beams and generating a single reproduced image by performing image processing for the plurality of reproduced images.

16 Claims, 13 Drawing Sheets

HOLOGRAM-REPRODUCING METHOD AND HOLOGRAM-REPRODUCING DEVICE

CROSS REFERENCES TO RELATED APPLICATIONS

The present invention contains subject matter related to Japanese Patent Application JP 2005-138619 filed in the Japanese Patent Office on May 11, 2005 and Japanese Patent Application JP 2005-198482 filed in the Japanese Patent Office on Jul. 7, 2005, the entire contents of which are incorporated herein by reference.

BACKGROUND OF THE INVENTION

1. Field of the Invention

The present invention relates to hologram storage configured to record and/or reproduce interference fringes of a signal-light beam and a reference-light beam onto and/or from a hologram-recording material, and particularly relates to a hologram-reproducing method and a hologram-reproducing device that are adapted to reproduce recorded information from the hologram material.

2. Description of the Related Art

In recent years, the holographic technology has been advanced rapidly, so as to make practical use of a holographic memory which receives attention, as a candidate for powerful storage which goes into competition with a next-generation optical disk and/or a next-next-generation optical disk. For example, hologram storage adapted to record and/or reproduce large-capacity data by using the hologram technology has been proposed, as disclosed in IBM J. RES DEVELOP VOL 44 NO. 3 MAY 2000 "Holographic data storage".

SUMMARY OF THE INVENTION

According to known hologram-storage units, however, brightness unevenness and/or partial omission often occurs in a hologram-reproduction image due to the instability of a laser-light source, the shrinkage of a hologram-recording material, and so forth. The brightness unevenness and/or partial omission increases the bit-error rate (bER) while the image data is decoded. Further, the brightness unevenness and/or partial omission may prevent the entire data page from being reproduced. According to a known hologram-reproducing method, a hologram is reproduced by applying a reproduction-reference light beam from the same position as a recorded reproduction-light position. Therefore, the known hologram-reproducing method is easily affected by the above-described brightness unevenness and partial omission. Further, the improvement of an optical system, a hologram-recording material, and so forth is not effective enough to solve the above-described problems. Thus, the above-described brightness unevenness and/or partial omission has prevented the holographic memory from being developed for commercial use.

Accordingly, the present invention provides a hologram-reproducing method and a hologram-reproducing device, so as to reproduce a high-quality hologram image free of brightness unevenness and partial omission, even though the characteristic and stability of an optical system and/or a hologram-recording material used for the hologram-reproducing device and/or the hologram-reproducing method are at an ordinary level.

Therefore, the present invention provides a hologram-reproducing method adapted to obtain a reproduced image by irradiating a hologram-recording material with a reference-light beam so that a reproduction signal-light beam is generated and picking up the image of the reproduction signal-light beam. According to the hologram-reproducing method, the hologram-recording material is irradiated with a plurality of reference-light beams so that a plurality of reproduced images is obtained, where the plurality of reference-light beams is equivalent to and/or different from a reference-light beam used for data recording. The plurality of reproduced images is subjected to image processing, so that a single reproduced image is obtained.

The present invention further provides a hologram-reproducing method adapted to obtain a reproduced image by irradiating a hologram-recording material with a reference-light beam so that a reproduction signal-light beam is generated and picking up an image of the reproduction signal-light beam. The hologram-reproducing method includes the steps of obtaining a plurality of reproduced images by irradiating the hologram-recording material with a plurality of reference-light beams, where the plurality of reference-light beams is made incident on the hologram-recording material at an angle equivalent to and/or different from an angle at which a reference-light beam used for data recording is made incident on the hologram-recording material; and obtaining a single reproduced image by performing image processing for the plurality of reproduced images.

The present invention further provides a hologram-reproducing method adapted to obtain a reproduced image by irradiating a hologram-recording material with a reference-light beam so that a reproduction signal-light beam is generated and picking up an image of the reproduction signal-light beam. The hologram-reproducing method includes the steps of obtaining a plurality of reproduced images by irradiating the hologram-recording material with a plurality of reference light beams, wherein a relationship between the plurality of reference light beams and a reproduction-target recording area of the hologram-recording material is equivalent to and/or different from a relationship between a reference light beam used for data recording and the reproduction-target recording area, and obtaining a single reproduced image by performing image processing for the plurality of reproduced images.

Thus, according to the present invention, the hologram-recording material is irradiated with the plurality of reference-light beams equivalent to and/or different from the reference-light beam used for the data recording. That is to say, when an image recorded according to an angle-multiplexing method is reproduced, a plurality of reference-light beams of which angle is changed over a predetermined range including the incident angle of the reference-light beam used for the data recording, so as to reproduce a target image. Then, images of a plurality of reference-signal light beams obtained at that time are picked up consecutively and peak values of pixels of obtained image data items are collected and made into a single reproduced image. By performing the above-described image processing, it becomes possible to reproduce a high-quality hologram image free of brightness unevenness, partial omission, and so forth by using an ordinary optical system which shows instability of a laser-light source, variations in an optical system, and so forth, and/or an ordinary hologram-recording material which often shrinks.

According to the present invention, the hologram-recording material is irradiated with the plurality of reference-light beams equivalent to and/or different from the reference-light beam used for data decoding so that a plurality of reproduced images is obtained. The plurality of reproduced images is subjected to image processing and made into a single reproduced image. Subsequently, it becomes possible to generate a hologram image adequate to decode data without performing positioning of a reproduction-reference light beam when reproducing the hologram image. Further, even though the record reference-light beam and the reproduction-reference light beam are shifted from each other due to variations in an optical system, instability of a laser, shrinkage of a medium, and so forth, an obtained hologram image can be corrected and changed into a high-quality hologram image for reproduction by performing the image processing. Further, crosstalk components and noise components are derived from hologram-reproduction images around a target hologram-reproduction image, and the target hologram-reproduction image is subjected to the image processing by using the above-described components. Subsequently, the crosstalk components are reduced, and a hologram-reproduction image with an increased signal-to-noise (S/N) ratio and an increased contrast can be reproduced. Subsequently, the error rate of data decoding can be decreased significantly.

DESCRIPTION OF THE PREFERRED EMBODIMENTS

For reproducing a high-quality hologram image free of brightness unevenness and/or partial omissions even though the characteristic and/or stability of an optical system and/or a hologram-recording material is at a normal level, the hologram-recording material is irradiated with a plurality of reference-light beams equivalent to and/or different from a reference-light beam used for data recording. That is to say, for example, when an image recorded according to an angle-multiplexing method is reproduced, a plurality of reference-light beams of which angle is changed over a predetermined range including the incident angle of the reference-light beam used for the data recording is used, so that a plurality of reproduction signal-light beams is obtained. The image of the reproduction-signal light beams is picked up consecutively and the peak values of pixels of obtained image-data items are collected and made into a single reproduced image. Thus, the high-quality hologram image can be reproduced by performing the above-described image processing.

First Embodiment

Figure 1:
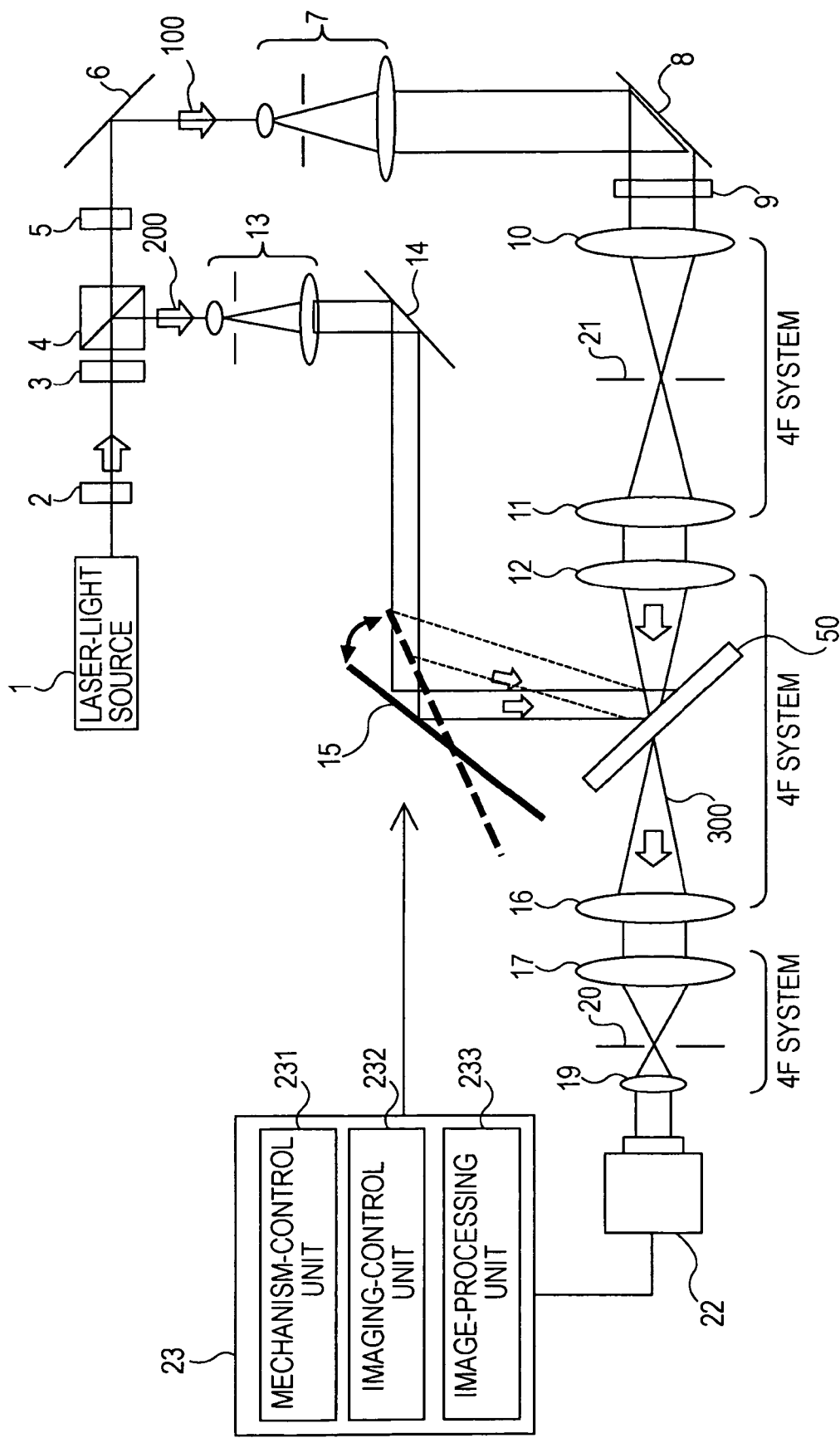
FIG. 1 is a block diagram illustrating the configuration of a hologram-reproducing device according to an embodiment of the present invention.

FIG. 1 is a block diagram illustrating the configuration of a hologram-reproducing (-and-recording) device according to a first embodiment of the present invention. The hologram-reproducing (-and-recording) device is configured to multiple-record and/or multiple-reproduce image data according to an angle-multiplexing method and includes a laser-light source 1, a shutter 2, a half-wavelength plate 3, a polarization-beam splitter (PBS) 4, a shutter 5, a mirror 6, a spatial filters 7 and 13, mirrors 8 and 14, a spatial-light modulator (SLM) 9, lenses 10, 11, 12, 16, 17 and 19, a rotatable mirror 15, apertures 20 and 21, an image sensor 22, and a control device 23, so as to record and/or reproduce a hologram image onto/from a hologram-recording material 50. Here, each of the lenses 10 and 11, the lenses 12 and 16, and the lenses 17 and 19 forms a 4F system. Further, the control device 23 includes a mechanism-control unit 231, an image-pickup control unit 232, and an image-processing unit 233. The mechanism-control unit 231 makes the rotatable mirror 15 rotate, so as to change the angle at which a reference-light beam 200 is made incident on the hologram-recording material. The image-pickup-control unit 232 picks up the image of a reproduction-signal light beam by controlling the image sensor 22 in synchronization with the change in the incident angle of the reference-light beam 200. The image-processing unit 233 performs image processing (described later) for the picked-up image.

Hereinafter, operations of the hologram recording-and-reproducing device according to the first embodiment will be described schematically. First, the shutters 2 and 5 are opened while data is recorded. A laser-light beam emitted from the laser-light source 1 is made incident on the PBS 4 via the shutter 2 and the half-wavelength plate 3, and divided into a signal-light beam 100 and a reference-light beam 200. The signal-light beam 100 is transmitted through the shutter 5, the mirror 6, the spatial filter 7, the mirror 8, and the SLM 9, so as to be spatially modulated by using a data page. The spatially-modulated signal-light beam 100 is condensed on the hologram-recording material 50 via the lenses 10, 11, and 12. The reference-light beam 200 is applied onto the hologram-recording material 50 via the spatial filter 13, the mirror 14, and the rotatable mirror 15. Subsequently, interference fringes of the signal-light beam 100 and the reference-light beam 200 are recorded onto the hologram-recording material 50. At that time, the rotatable mirror 15 is rotated every time the data page is changed, the data page being used for modulating the signal-light beam 100. Subsequently, the angle at which the reference-light beam 200 is made incident on the hologram-recording material 50 is changed. Therefore, the interference fringes are recorded onto one and the same recording area of the hologram-recording material 50 according to the angle-multiplexing method.

When the recorded data is reproduced, the shutter 2 is opened and the shutter 5 is closed. Therefore, only the reference-light beam 200 is applied onto the hologram-recording material 50 via the rotatable mirror 15 and a reproduction-signal light beam 300 is generated. The reproduction-signal light beam 300 is made incident on the image sensor 22 via the lenses 16, 17, and 19, whereby reproduction-image data is obtained. At that time, the angle at which the reference-light beam 200 is applied onto the hologram-recording material 50 is changed so that the image-data items recorded in the multiplexing manner are reproduced in sequence.

Next, reproduction operations performed by the above-described hologram-recording-and-reproducing device will be described in detail. According to the first embodiment, the rotatable mirror 15 is rotated continuously so that the image data recorded onto the hologram-recording material 50 is reproduced by using a plurality of reproduction-reference-light beams near a record-reference-light beam. However, for reproducing the image data recorded according to the known angle-multiplexing method, the rotatable mirror 15 is controlled so that the angle thereof agrees with that of the reference-light beam used for data recording. When the angle of the rotatable mirror 15 agrees with that of the reference-light beam, the image sensor 22 picks up a hologram-reproduction image. The above-described reproduction operations are also performed when the image data is recorded according to a shift-multiplexing method. Namely, a medium (hologram-recording material) is moved under control so that the position relationship between the reference-light beam 200 and a record spot agrees with that achieved when the image data is recorded. When both the position relationships agree with each other, the hologram-reproduction image is picked up.

Thus, when the image data is reproduced according to the known multiplexing methods, and the optical systems, the medium, and so forth are operated under good conditions so that a stable hologram-reproduction image can be picked up, known reproduction methods can be used without problems. In reality, however, it is often difficult to pickup the stable hologram-reproduction image at a position where the image data is recorded due to the instability of laser-light source, the medium shrinkage, variations in the optical systems, and so forth.

According to the first embodiment, therefore, when an angle-multiplexed optical system is used, the rotatable mirror 15 is moved continuously, or moved with a pitch smaller than an angle pitch used when the image data is recorded so that a plurality of hologram-reproduction images is picked up near the record-reference-light beam. By performing image processing for the hologram-reproduction images, a single hologram-reproduction image is regenerated, so as to be reproduced in an adequate manner. For generating the hologram-reproduction image, the rotatable mirror 15 is rotated at the record spot where the hologram is recorded of the hologram-recording material 50 so that the angle at which the reference-light beam 200 is made incident on the hologram-recording material 50 (the reproduction-light angle) is changed continuously.

Figure 2:
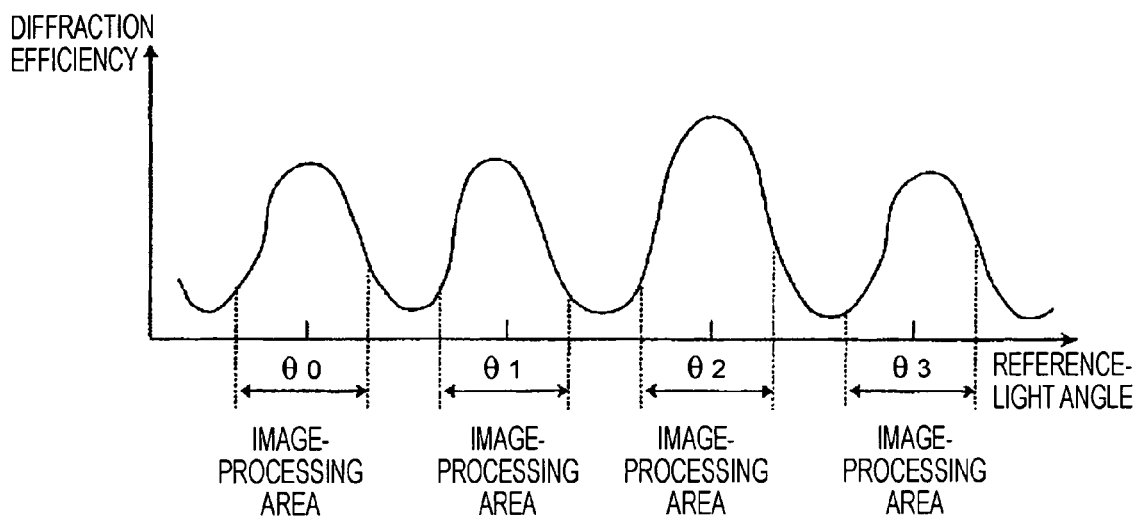
FIG. 2 is a waveform diagram indicating the relationship between a reference-light angle and the diffraction efficiency of a hologram.

FIG. 2 shows the result of measurement of the diffraction efficiency of the hologram with reference to the reference-light angle. In FIG. 2, each of signs $\theta_0$, $\theta_1$, $\theta_2$, and $\theta_3$, shows the angle of the reference-light beams used for recording the hologram. Each of the signs $\theta_0$, $\theta_1$, $\theta_2$, and $\theta_3$ corresponds to an image-processing area where a plurality of picked-up images is subjected to image processing. The plurality of picked-up images is obtained by continuously changing the incident angle of the reproduction-reference light with reference to the reference-light angle, where the reproduction-reference light is used when the hologram is reproduced. When the hologram is recorded and/or reproduced by using an ideal system free of the above-described laser-light-source instability, medium shrinkage, optical-system variations, and so forth, it becomes possible to reproduce an adequate hologram image by performing hologram reproduction at the reference-light angle used for data recording.

Figure 3:
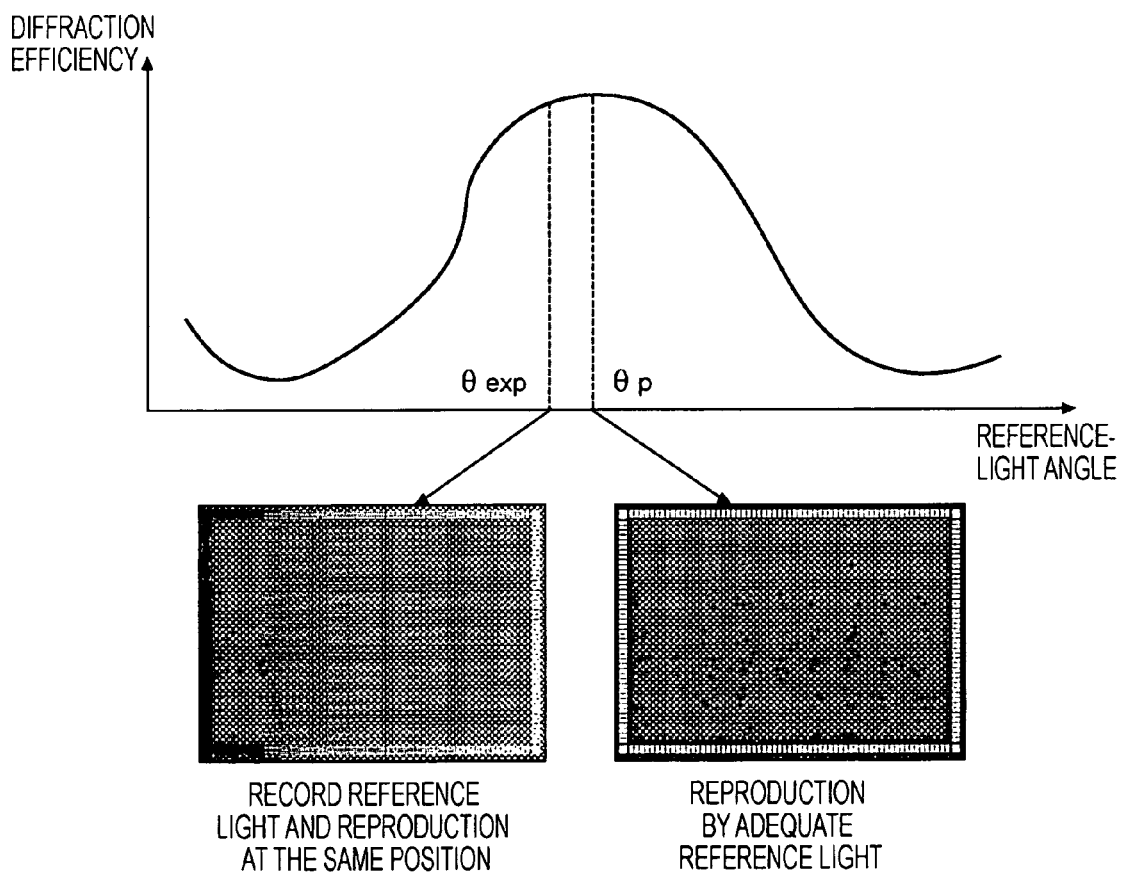
FIG. 3 shows a shift between the diffraction efficiency of the hologram corresponding to a reference-light angle adequate to record the hologram and the diffraction efficiency of the hologram corresponding to a reference-light angle adequate to reproduce the hologram.

In reality, however, it is often difficult to reproduce an adequate hologram image at a reference-light position where the data recording is performed by using a real optical system, as shown in FIG. 3. In FIG. 3, sign $\theta_{exp}$ indicates the angle of the reference-light beam used when the hologram recording is performed. Since the position of an adequate reproduction reference-light beam is shifted, it is difficult to obtain the maximum diffraction efficiency even though the hologram is reproduced at angle $\theta_{exp}$. Therefore, if the hologram is reproduced at angle $\theta_{exp}$, the brightness of the entire image decreases and brightness unevenness occurs, for example. In FIG. 3, sign $\theta_p$ indicates the reference-light angle where the maximum diffraction efficiency is achieved. Namely, the position of the reference-light beam used for recording the hologram is different from that of the reference-light beam appropriate for reproducing the hologram data by as much as $|\theta_p - \theta_{exp}|$.

Figure 4:
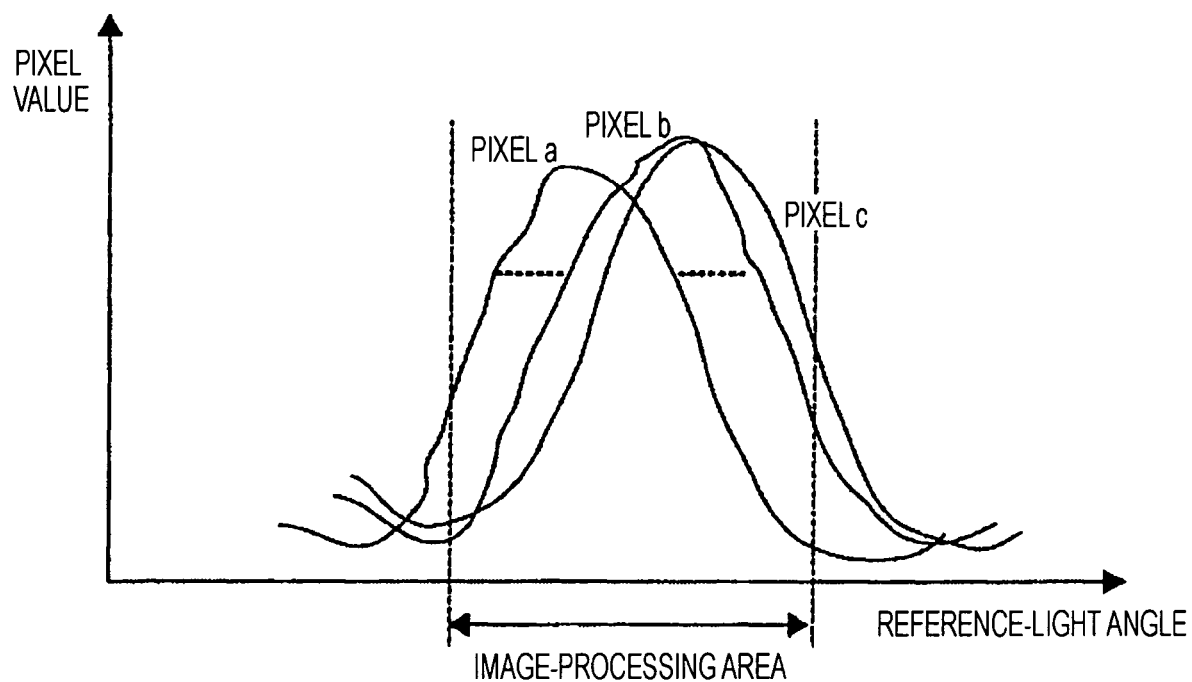
FIG. 4 shows the relationship between the reference-light angle of each pixel and the brightness level (pixel value)

Thus, FIG. 3 shows the relationship between the reference-light angles and the diffraction efficiencies of the entire hologram. FIG. 4 shows the relationship between the reference-light angle and each of pixels of the hologram image. FIG. 4 shows the profiles of pixels a, b, and c for the sake of clarity. In reality, however, the profile is measured for each of the pixels of the entire hologram image. It should be noted that the peaks of diffraction efficiencies of the pixels are shifted from one another. If an ideal optical system was used, the peaks of diffraction efficiencies of the pixels would not be shifted from one another and the profiles measured for all of the pixels would agree with one another. In the case where a real optical system is used, however, the profiles shown in FIG. 4 are obtained and the differences between the profiles of the pixels are observed, as the brightness unevenness of a hologram-reproduction image.

According to known hologram-reproducing methods, basically, image data is reproduced at the same reference-light position as that where the image data is recorded, and a single image is picked up at the reference-light position. According to the known methods, however, the brightness decreases due to the decreased diffraction efficiency of the entire data page, as described above, and it is difficult to reduce the brightness unevenness. In the first embodiment, therefore, it is noted that the profiles of the pixels are different from one another, as shown in FIG. 4. Namely, a hologram-reproduction image is consecutively picked up at positions around the record-reference-light position, and image processing is performed by using a plurality of images so that the above-described problems are solved. Hereinafter, a method of performing the above-described image processing will be described.

Figure 5:
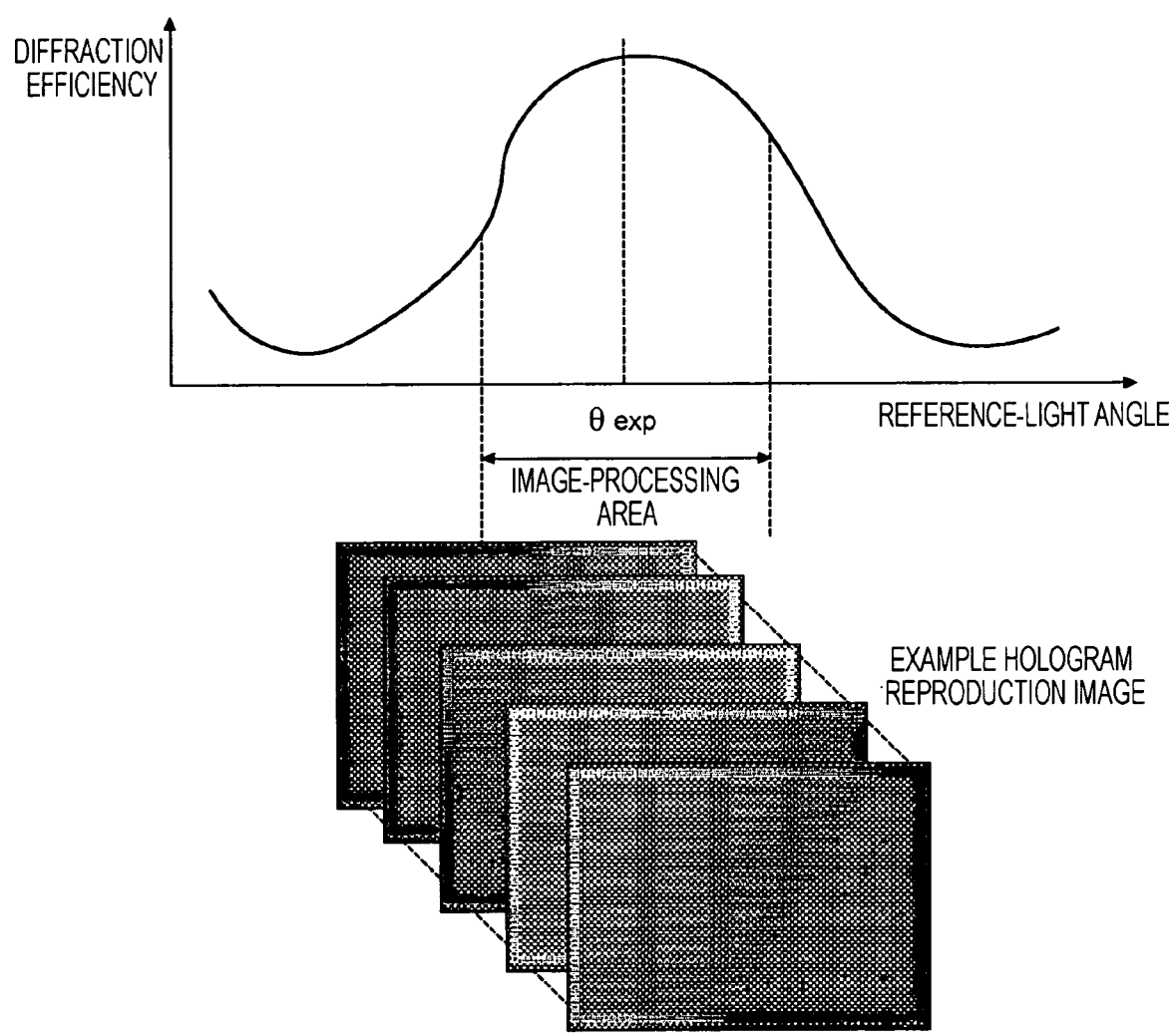
FIG. 5 shows a sequence of hologram-reproduction images obtained from a consecutive-image processing area.

As shown in FIG. 5, a range including all of angles where the maximum diffraction efficiency is achieved for each of pixels is determined to be an image-processing area. For example, when an angle-multiplexing optical system is used, the reference-light rotatable mirror 15 is rotated continuously so that the hologram-reproduction image is consecutively picked up by the image sensor 22. Then, the above-described image processing is performed for a sequence of consecutive images shown in FIG. 5, the consecutive images being picked up in the above-described image-processing area.

Figure 6:
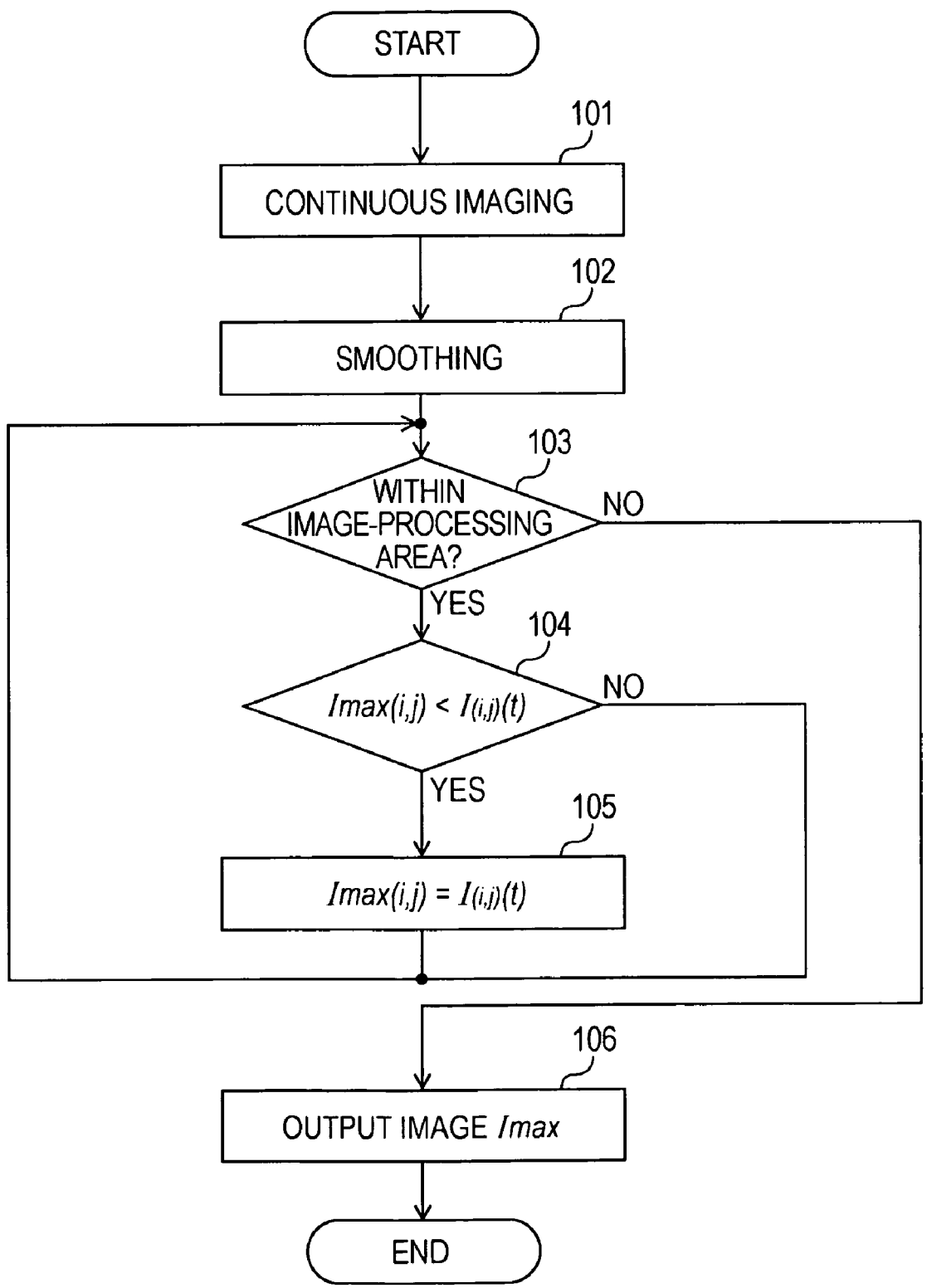
FIG. 6 is a flowchart showing an image-processing algorithm used for performing image processing according to the above-described embodiment.
Figure 7:
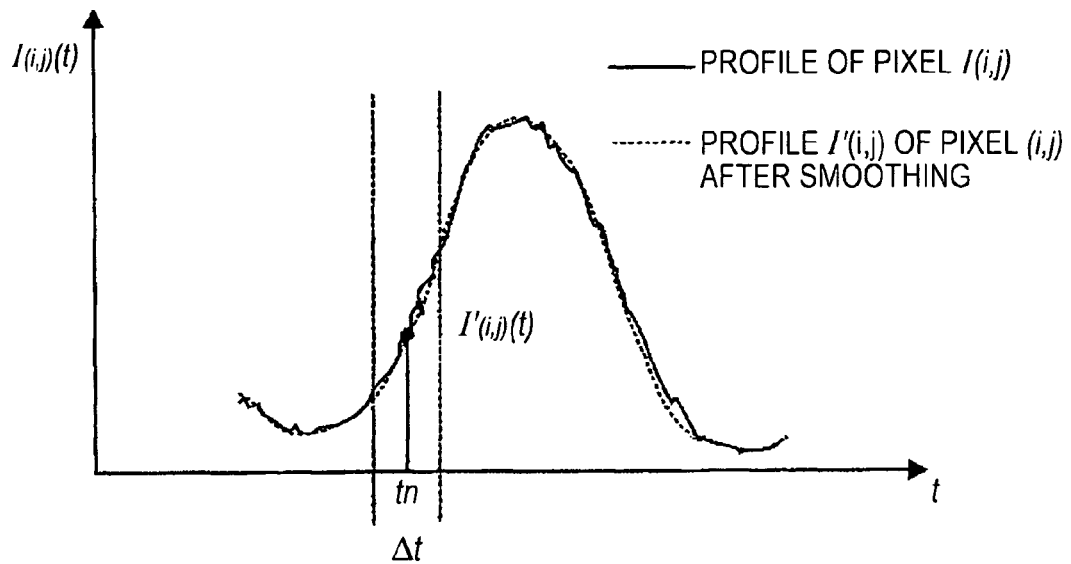
FIG. 7 shows smoothing processing performed for the pixel profile.

FIG. 6 is a flowchart illustrating an image-processing algorithm used for performing the above-described image processing. First, at step 101, the rotatable mirror 15 is controlled and continuously rotated in a consecutive-image-pickup area shown in FIG. 5 so that the incident angle of the reference-light beam 200 is continuously changed. Subsequently, the reproduction signal-light beam 300 is obtained and the image thereof is consecutively picked up by the image sensor 22. Next, at step 102, integration processing shown as Expression (1) is performed for a profile (solid line) shown in FIG. 7 of each of the pixels, as preprocessing performed in advance of a maximum-value search performed in the subsequent step, so that the profile is smoothed (broken line). In reality, the picked-up images include noise components which may be recorded, as the maximum value, when the maximum-value search is conducted for a sequence of the picked-up images without performing the preprocessing. Therefore, the smoothing is performed. Then, at steps 103, 104, and 105, a search for the maximum value of each of pixels in the image-processing area is performed. After the maximum value is obtained, the maximum value is output, at step 106. That is to say, the above-described image processing is performed, so as to regenerate a single image. Each of pixels of the single image shows its largest value. The regeneration of the single image is achieved by making a search for the maximum value of each of the pixels in the image-pickup time-axis direction and storing the maximum value of each of the pixels.

$$I'_{(i,j)}(t_n) = \frac{\int_{t_n-\Delta t/2}^{t_n+\Delta t/2} I_{(i,j)}(t)dt}{\Delta t} \qquad \text{Expression (1)}$$

Figure 8:
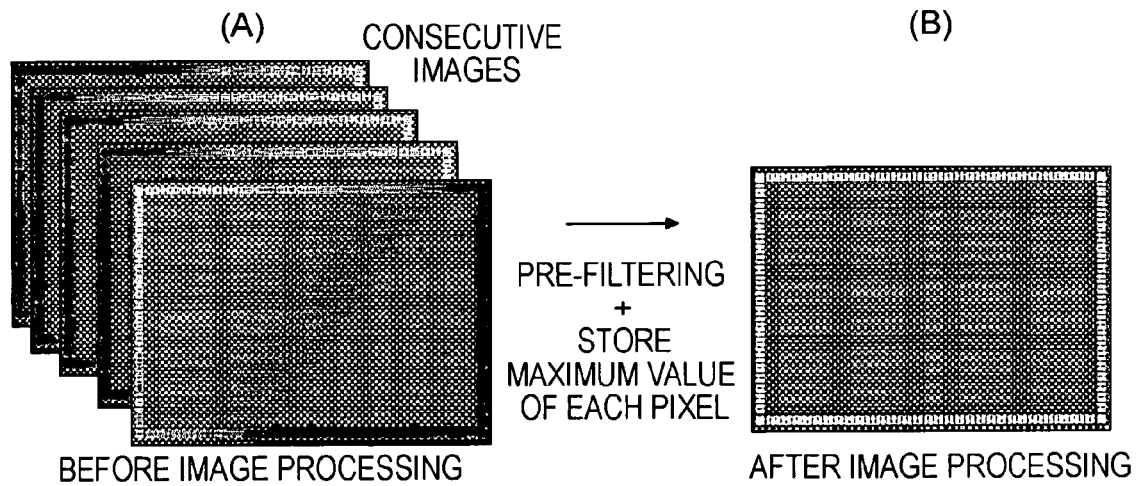
FIG. 8 shows example images obtained before and after the image processing is performed.

By performing the above-described image processing, it becomes possible to regenerate a single hologram image subjected to image-improving processing shown in FIG. 8B from a sequence of hologram-reproduction images showing brightness unevenness and/or decreased brightness shown in FIG. 8A. A decrease in the image brightness often becomes significant in the periphery of an image. However, at least one positioning marker required for decoding data recorded on the hologram is recorded onto the periphery. Subsequently, it becomes possible to reduce the decrease in the brightness of the image by performing the above-described image processing, and the data recorded on the hologram can be decoded with stability.

The above-described algorithm can be achieved on the premise that the position of the hologram image is not changed while the hologram image is consecutively picked up. In recent years, the frame rate of a complementary-metal-oxide-semiconductor (CMOS) image sensor which is used, as the image sensor 22, has become increasingly high. Therefore, the hologram image is picked up consecutively in a short time period by a fixed image-pickup system so that the hologram image is prevented from being shifted from its original position. If the hologram image is shifted from its original position in spite of the above-described countermeasure, position-shift compensation may be performed by performing positioning by using the positioning marker recorded onto a data page.

Figure 9:
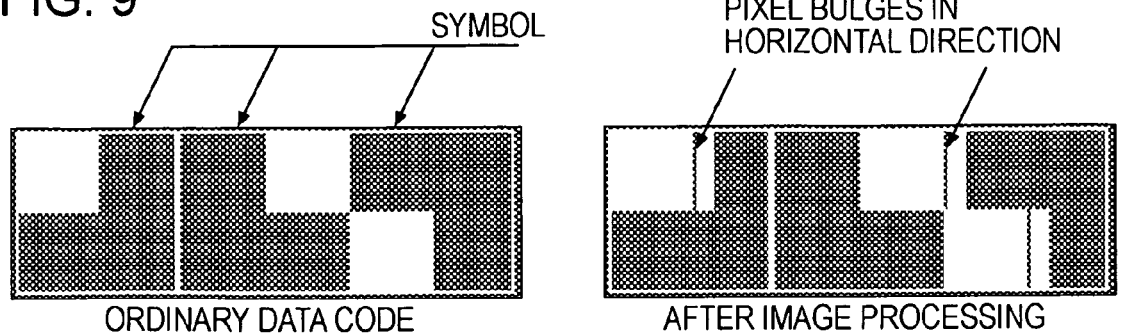
FIG. 9 shows pixels which bulge while the image processing is performed.
Figure 10:
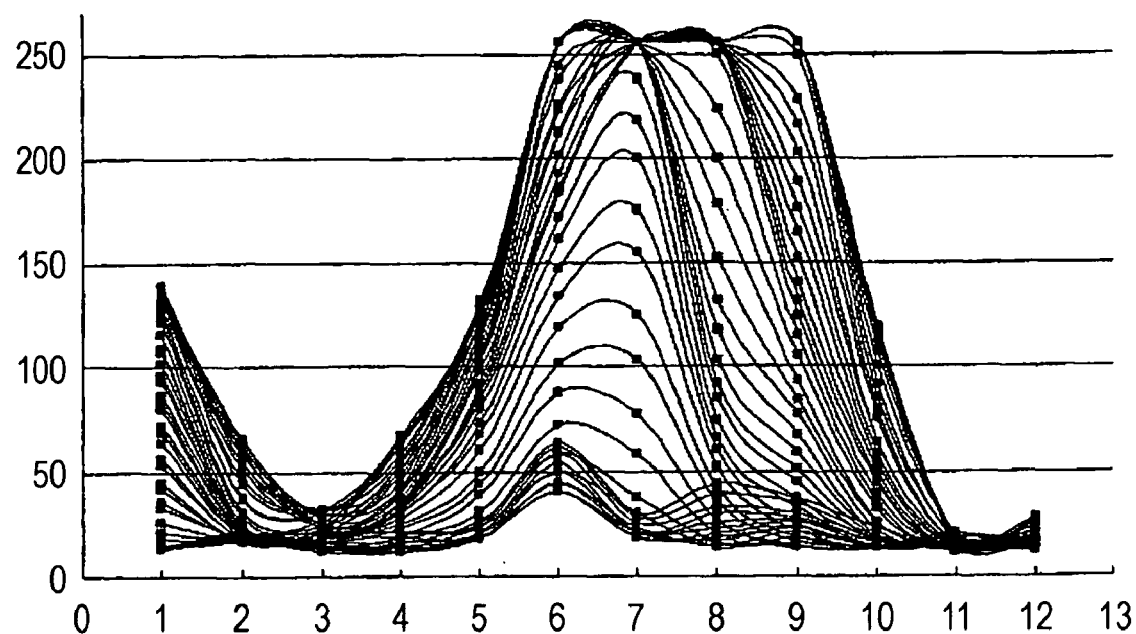
FIG. 10 shows profiles obtained when it is determined that an image-processing area includes fifty frames.

Here, at the above-described steps where the maximum values are stored (steps 103 to 105), data symbols often bulge in a direction parallel to the lateral side of the image due to the aberration of the optical system after the image processing is finished, as shown in FIG. 9B. The above-described bulges can be confirmed by comparing a normal data code shown in FIG. 9A with a data code shown in FIG. 9B, the data code being subjected to the image processing. In that case, the bER may be increased due to an inter-code interference generated by the bulged data symbol and the data symbol adjacent thereto. Here, one of the data symbols provided on the image is taken, as an example. Since the profile of the example data symbol varies with time (change in the reference-light-angle direction), different profiles are obtained. FIG. 10 shows the different profiles superimposed on one another. As shown in FIG. 10, each of the profiles is laterally asymmetrical and the expansion of the profile may become larger than that of a minimum pixel unit included in the data symbol. If the profile is laterally symmetrical and the expansion thereof is almost the same as that of the minimum pixel unit, the inter-code interference does not occur.

Figure 11:
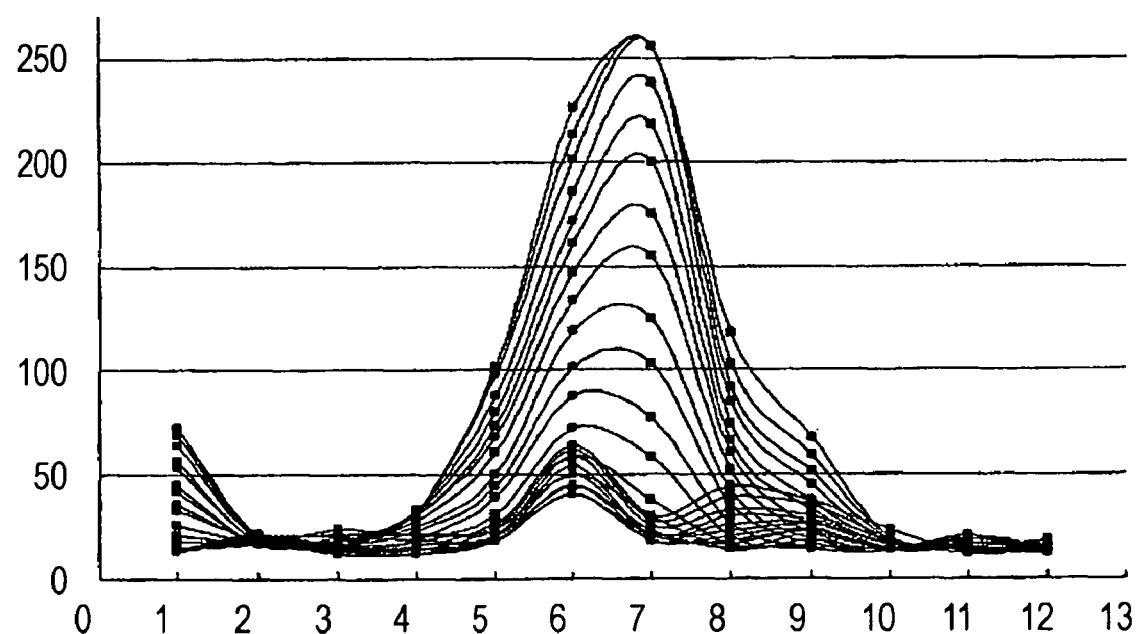
FIG. 11 shows profiles obtained when it is determined that the image-processing area includes thirty frames.

FIG. 10 shows the time-varying profiles superimposed on one another when it is determined that the image-processing area includes fifty frames. If the image-processing area is controlled so that the number of frames is reset to thirty near the data symbol (the last twenty frames of the fifty frames are not included in the image-processing area), profiles shown in FIG. 11 are generated. Thus, the number of frames of the image used for performing the maximum-value search is optimized, where details on the optimization vary with locations on the image. Subsequently, it becomes possible to reduce the pixel bulges caused by the aberration of the optical system and the inter-code interference. Since the pixels bulge in the direction that the reference-light beam moves, that is, the direction parallel to the horizontal side of the image, the frame number should be determined and unchanged when the image processing is performed in the direction of the image sequence.

For reproducing a target image according to the first embodiment, the angle of the reference-light beam 200 used for the data reproduction is continuously changed over a predetermined range including the incident angle of the reference-light beam used for the data recording. Subsequently, the reproduction signal-light beam 300 is obtained and the image sensor 22 picks up the image of the reproduction signal-light beam 300 consecutively. Then, the peak values of pixels of the picked-up images are collected and made into a single reproduced image. Therefore, in the case where an optical system and/or the hologram-recording material 50 at an ordinary level is used, which arises instability of the laser-light source 1, a shrinkage of the hologram-recording material 50, and variations in the optical system, it becomes possible to reproduce a high-quality hologram image free of the brightness unevenness, the partial omission, and so forth.

According to the algorithm shown in FIG. 6, the images are consecutively picked up over the entire range where the angle of the reference-light beam changes, the range being illustrated in FIG. 3. However, the continuous image-pickup may be performed only for the image-processing area shown in FIG. 2, so as to achieve the same advantage as that obtained by the algorithm shown in FIG. 6.

Second Embodiment

Figure 12A:
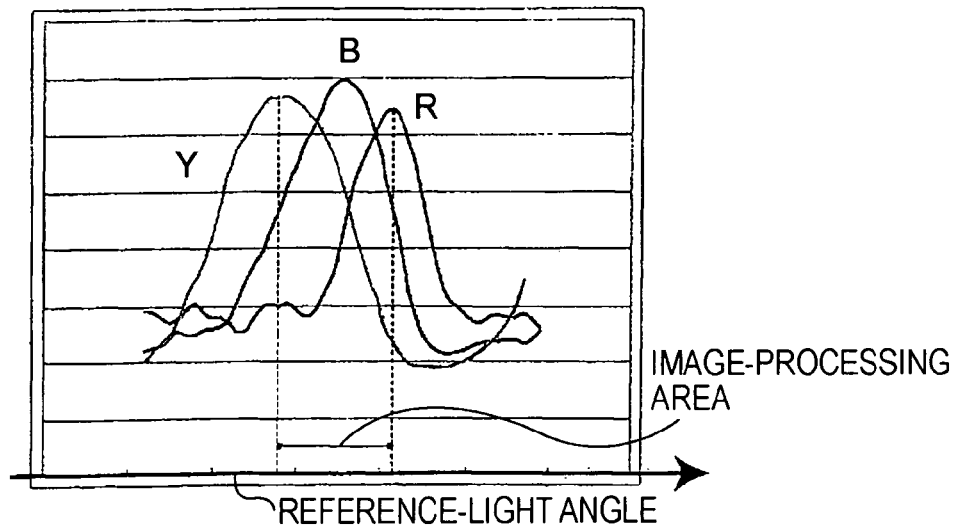
FIG. 12 illustrates a hologram-reproducing method according to another embodiment of the present invention.
Figure 12B:
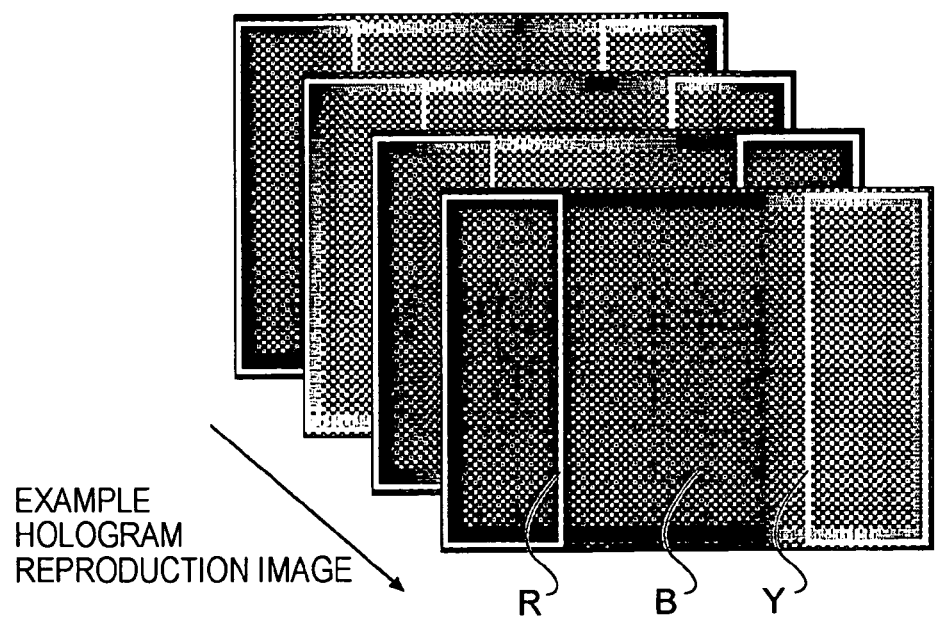

FIGS. 12A and 12B illustrate a hologram-reproducing method according to a second embodiment of the present invention. Namely, FIGS. 12A and 12B illustrate variations in the sum total of the pixel values (variations in the diffraction efficiency) and how the image-processing area is specified according to the variations in the total sum of the pixel values. When the image-processing area shown in FIG. 2 varies by each hologram, that is, when it is difficult to specify the image-processing areas at regular intervals, the image-processing areas are specified dynamically. In the case of FIGS. 12A and 12B, part of the hologram-reproduction image is specified and the sum total of values of all of pixels included in the specified part is calculated. Further, changes in the total sum over time (changes in the direction of the reference-light angle in the second embodiment) are calculated, as shown in FIG. 12A. When the reference-light angle is determined, the image brightness starts changing from an edge area of the image. Therefore, areas specified by frames red (R) and yellow (Y) are provided on the left and right sides of each of images shown in FIG. 12B, and the total sum of the pixel values is calculated in each of the areas. The colors of graphs shown in FIG. 12A correspond to those of the frames of the areas provided in each of the images shown in FIG. 12B. Therefore, it is easy to understand that that the peak (blue (B)) of the total sum of the pixel values of the entire image exists between the peak (red (R)) of the total sum of the pixel values of the area provided on the left side of the image and the peak (yellow (Y)) of the total sum of the pixel values of the area provided on the right side of the image.

That is to say, the brightness of the hologram-reproduction image starts changing from any of the edge areas thereof (the yellow area on the right side of the image in the second embodiment) and the brightness of the entire image increases. Then, the brightness change is finished in the edge area opposite to the yellow area (the red area on the left side of the image in the second embodiment). Therefore, the peak of the sum total of the pixel values of each of the areas provided on both sides of the image is calculated and a range between the above-described peaks is determined to be the image-processing area. Subsequently, it becomes possible to generate a hologram-reproduction image with corrected brightness in the automatically-specified image-processing area according to an image-processing method achieved on the basis of another embodiment of the present invention. Here, when detecting the peak of the brightness profile, the smoothing processing described in FIG. 7 may be performed, as preprocessing which is effective when the brightness profile is affected by a noise component.

For example, if there is a difference between the temperatures of the recording medium, the temperatures being measured at the hologram-recording time and the hologram-reproducing time, and the recorded interference fringes change significantly due to the thermal expansion of the recording medium, only a small part of the hologram-reproduction image is reproduced at any reference-light-angle position. Further, crosstalk between the above-described hologram-reproduction image and a hologram image written into the part corresponding to the angle position adjacent to that of the above-described hologram-reproduction image becomes significant. In that case, if the entire hologram-reproduction image is subjected to the image processing according to the above-described image-processing method in the same image-processing area, an obtained image includes a plurality of data codes. For preventing the above-described image from being generated, the image is divided into a plurality of regions (e.g., two regions in the second embodiment), and each of the regions is subjected to image processing performed on the basis of an image-processing method according to another embodiment of the present invention. Then, images generated in the divided regions are made into a single image. Thus, it becomes possible to generate a hologram-reproduction image with corrected brightness without using the plurality of data codes.

Figure 13A:
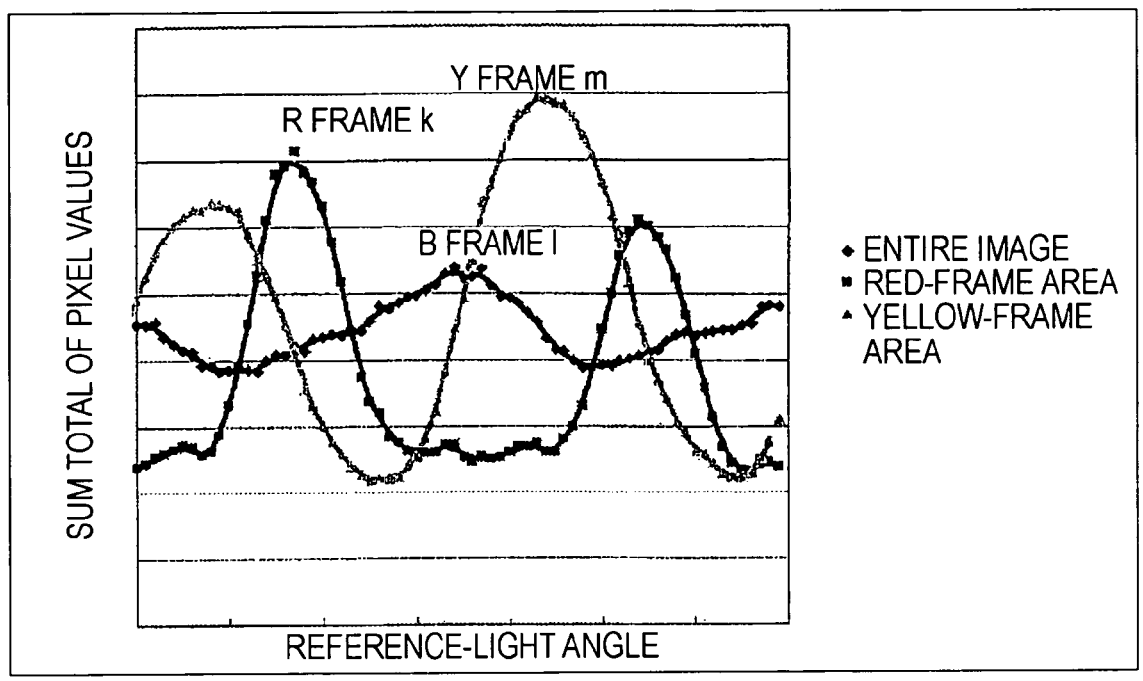
FIG. 13 shows variations in the sum total of pixel values and the image frames corresponding to peak values.
Figure 13B:
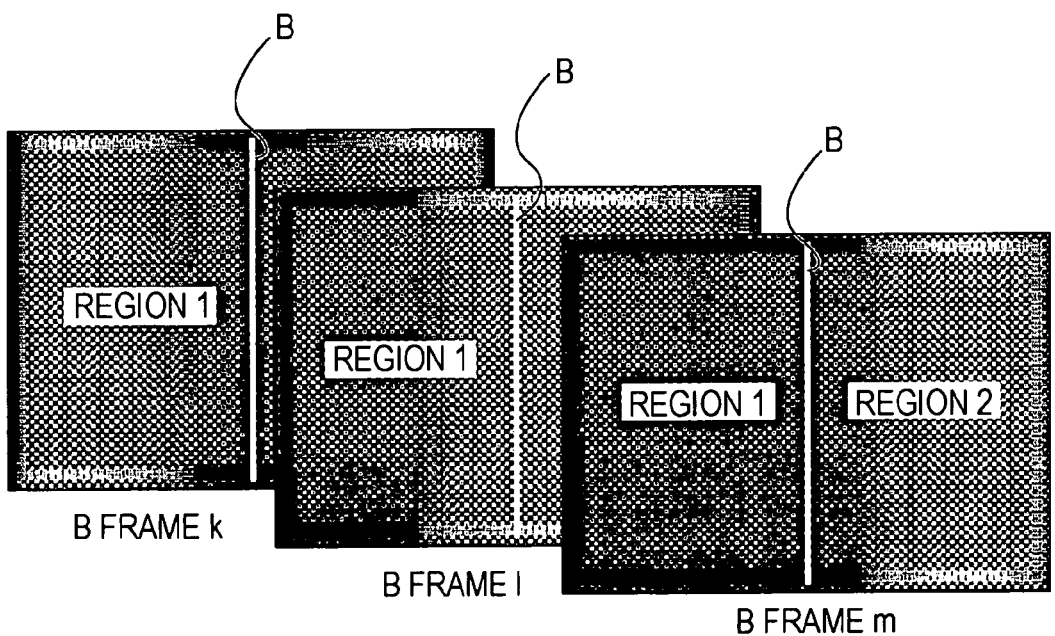

The above-described image-processing algorithm will be described with reference to FIGS. 13A and 13B. As is the case with FIG. 12A, FIG. 13A shows a graph indicating the sum total of pixel values of each of the regions, where the sum total is calculated while the reference-light angle is changed. Further, FIG. 13A also shows that the peak of the sum total of the pixel values of the entire image exists between that of the pixel values of the region defined by the frame (Y) and that of the pixel values of the region defined by the frame (R), and the image-processing area can be determined, as is the case with FIG. 12. However, when image processing according to another embodiment of the present invention is performed by using frames k, l, and m, crosstalk caused by a hologram generated at the adjacent angle position is also included in a generated hologram. Therefore, the image is divided into a plurality of regions (two regions including Region 1 and Region 2 in the second embodiment), as shown in FIG. 13B, and each of Region 1 and Region 2 is subjected to the image processing performed on the basis of an image-processing method according to another embodiment of the present invention. In the case of Region 1, the image-processing area corresponds to the Frame k-to-Frame l range. Further, in the case of Region 2, the image-processing area corresponds to the Frame l-to-Frame m range. In each of the Frame k-to-Frame l range and the Frame l-to-Frame m range, the image processing is performed by using a hologram image reproduced at a position which is sub-sampled in the angle direction.

Figure 14A:
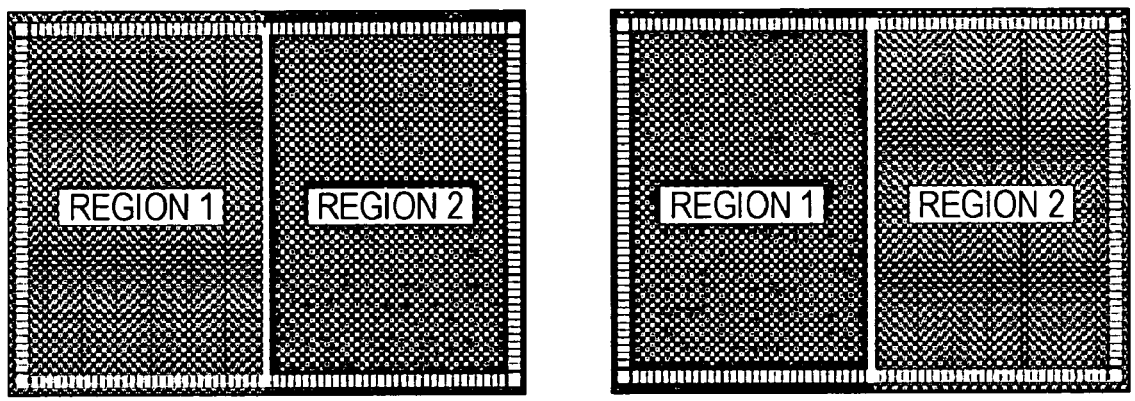
FIG. 14 shows images subjected to the image processing (by region) and a result of image synthesis.
Figure 14B:
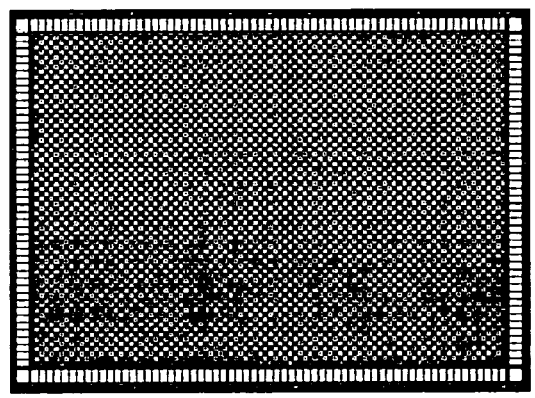

FIG. 14A shows the images generated in the above-described manner, where each of the images is generated for one of the regions. FIG. 14B shows a result image obtained by merging the generated images shown in FIG. 14A by performing image-synthesis processing. According to the image shown in FIG. 14B, even though the brightness discontinuity is observed around the boundary of the regions, the two regions are not shifted from each other in position. As long as the boundary of the modulation-code symbols agrees with that of the above-described image-processing areas, the brightness discontinuity does not affect the data-decoding performance.

According to the second embodiment, even though it is difficult to specify the image-processing area at regular intervals, the image-processing area may be specified automatically on the basis of variations in the pixel values of the image. Further, for example, when there is no difference between the positions of the image-processing areas of record books provided on the recording medium, the image-processing area may be derived from one of the record books according to the method described in the second embodiment, and the derived image-processing area may be stored in a look-up table (LUT). Further, the LUT may be used for reading data from another record book provided on the same recording medium, so as to decrease the amount of calculations performed when the image data is reproduced.

Third Embodiment

Figure 15:
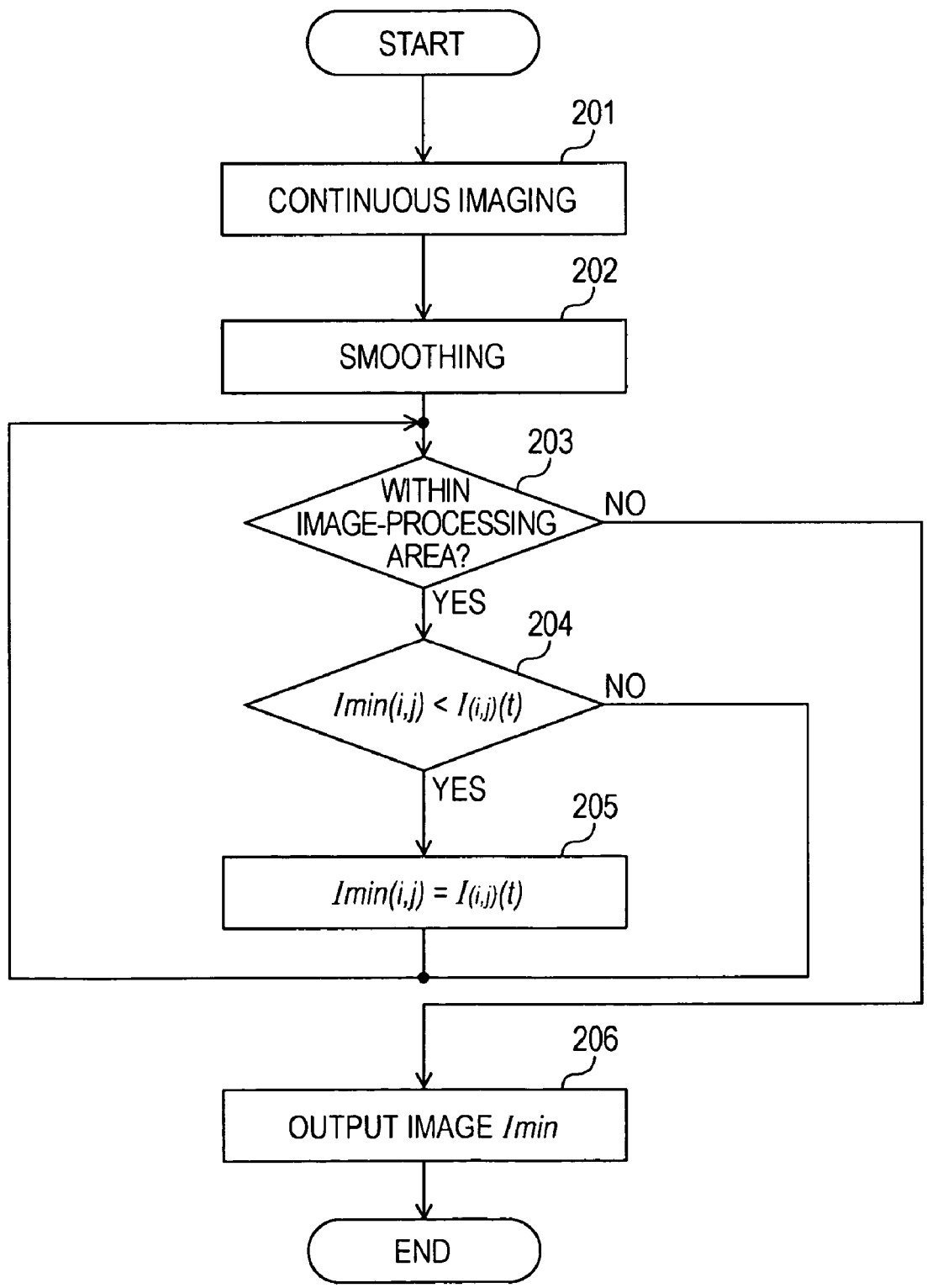
FIG. 15 is a flowchart showing image processing performed by a hologram-reproducing device according to another embodiment of the present invention.

FIG. 15 is a flowchart illustrating image processing performed by a hologram-reproducing device according to a third embodiment of the present invention. For recording and/or reproducing a hologram, multiple-image recording is performed with high multiplicity, so as to increase the recording density. Under normal conditions, however, the higher the multiplicity, the more detrimental crosstalk becomes for decoding data, the crosstalk being caused by the adjacent data page. According to the first embodiment, a hologram-reproduction image of the adjacent data page can be subjected to the above-described image processing, so as to reduce the brightness unevenness and partial omission thereof. The third embodiment has been achieved, so as to increase the quality of the hologram-reproduction image with reduced unevenness and partial omission by calculating the crosstalk component from the hologram-reproduction image and reducing the crosstalk component.

Figure 16:
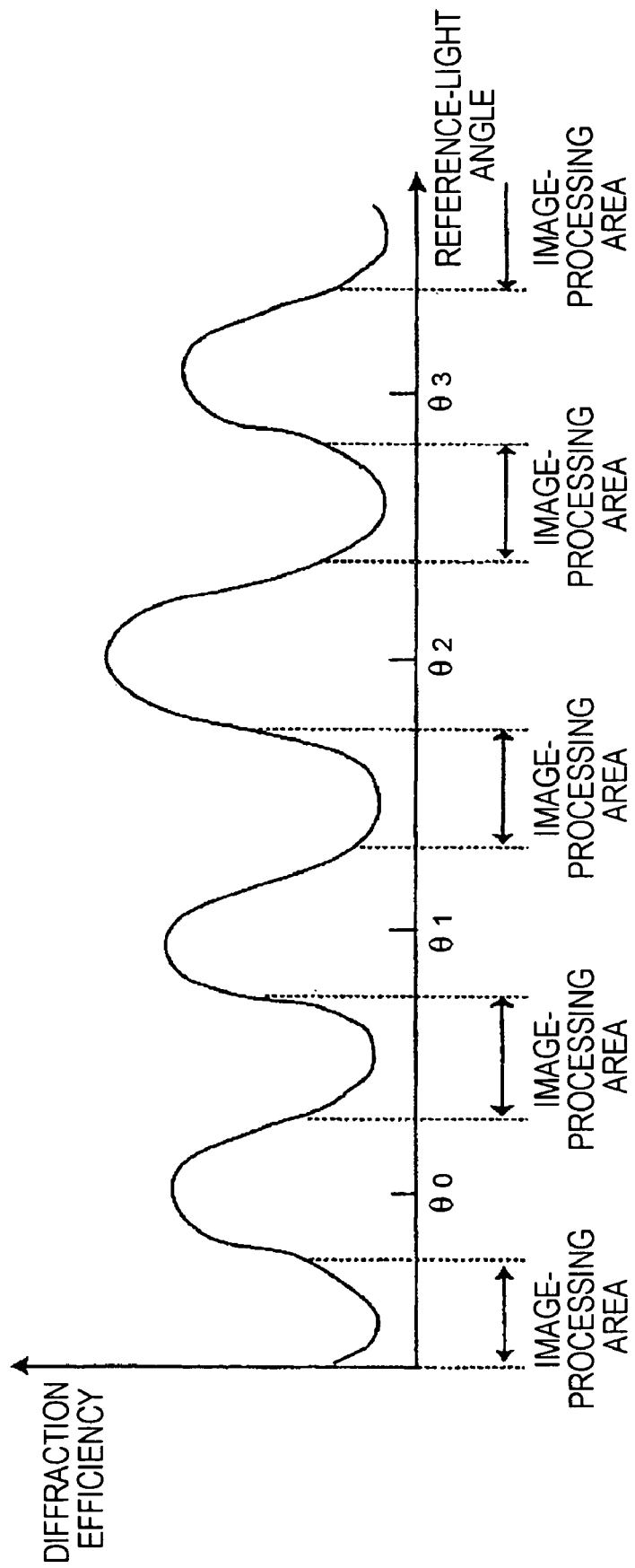
FIG. 16 is a waveform diagram showing the relationship between reference-light angles and the diffraction efficiency of holograms.

In the first embodiment, the image processing described in the flowchart of FIG. 6 is performed so that every pixel of the regenerated image shows its highest value. In the third embodiment, however, image processing adapted to store the minimum value of a pixel is performed by using adjacent images that had been picked up consecutively, as described in the flowchart of FIG. 15, so as to regenerate an image, where each pixel of the regenerated image shows its minimum value. That is to say, the image corresponding to noise components is generated. Although the processing procedures corresponding to steps 201 and 202 shown in FIG. 15 are the same as those corresponding to steps 101 and 102 shown in FIG. 6, an image-processing area described at step 203 shown in FIG. 15 is different from that described at step 103 shown in FIG. 6, as shown in FIG. 16. Namely, the image-processing area is determined, so that the image-processing area includes the pixel value corresponding to the minimum diffraction efficiency. At steps 203 to 205, the minimum value of every pixel of the image-processing area is calculated, and at step 206, the minimum pixel value is output. Namely, the above-described processing is performed, so as to regenerate a single image, where each of the pixels thereof shows its minimum value, by making a search for the minimum value of each of the pixels in the image-pickup time-axis direction and storing the minimum values.

The above-described regenerated image is used, so as to reduce the noise components of the image regenerated by performing the image processing described in the first embodiment, the image processing being adapted to store the maximum pixel values. Further, the image including the minimum pixel values may be generated by using the profile subjected to the smoothing processing illustrated in FIG. 7. FIG. 16 shows generation of the image corresponding to reference-light angle $\theta_1$, the generation being achieved by performing the above-described processing adapted to reduce crosstalk and noise components. An image regenerated near reference-light angle $\theta_0$ according to the above-described maximum-value-search algorithm is determined to be an image Ip0, an image regenerated near reference-light angle $\theta_1$ is determined to be an image Ip1, and an image regenerated near reference-light angle $\theta_2$ is determined to be an image Ip2. Further, an image regenerated between reference-light angle $\theta_0$ and reference-light angle $\theta_1$ according to the above-described minimum-value-search algorithm is determined to be an image Ib0, and an image regenerated between reference-light angle $\theta_1$ and reference-light angle $\theta_2$ is determined to be an image Ib1. At that time, an image Icr1 with reduced crosstalk and reduced noise is represented by Expression (2), where coefficients obtained from practical experience are determined to be coefp1, coefp2, coefb0, and coefb1.

$$I_{cr_1} = \text{coef}_{p_1} \cdot I_{p_1} - (\text{coef}_{p_0} \cdot I_{p_0} + \text{coef}_{p_2} \cdot I_{p_2} + \text{coef}_{b_0} \cdot I_{b_0} + \text{coef}_{b_1} \cdot I_{b_1})$$ Expression (2)

In Expression (2), the peak image of a desired image is represented by the first term at the right side. Expression (2) shows that peak images sandwiching the peak image of the desired image and crosstalk components that are represented by the second term at the right side are subtracted from the peak image of the desired image, so as to obtain a high-quality image. Expression (3) is obtained by generalizing Expression (2), so as to represent the n-th image Icrn.

$$I_{cr_n} = \text{coef}_{p_n} \cdot I_{p_n} - (\text{coef}_{p_{(n-1)}} \cdot I_{p_{(n-1)}} + \text{coef}_{p_{(n+1)}} \cdot I_{p_{(n+1)}} + \text{coef}_{b_{(n-1)}} \cdot I_{b_{(n-1)}} + \text{coef}_{b_n} \cdot I_{b_n})$$ Expression (3)

For reproducing a target image according to the third embodiment, the angle of the reference-light beam 200 used for the data reproduction is continuously changed over a predetermined range including the incident angle of the reference-light beam used for the data recording. Subsequently, the reproduction signal-light beam 300 is obtained and the image sensor 22 picks up the image of the reproduction signal-light beam 300 consecutively. Then, the peak values of all of pixels of the picked-up images are collected and made into a single reproduced image. Further, by subtracting crosstalk components from the reproduced image, the crosstalk components being caused by images adjacent to the reproduced image, for example, a high-quality image can be achieved.

Figure 17:
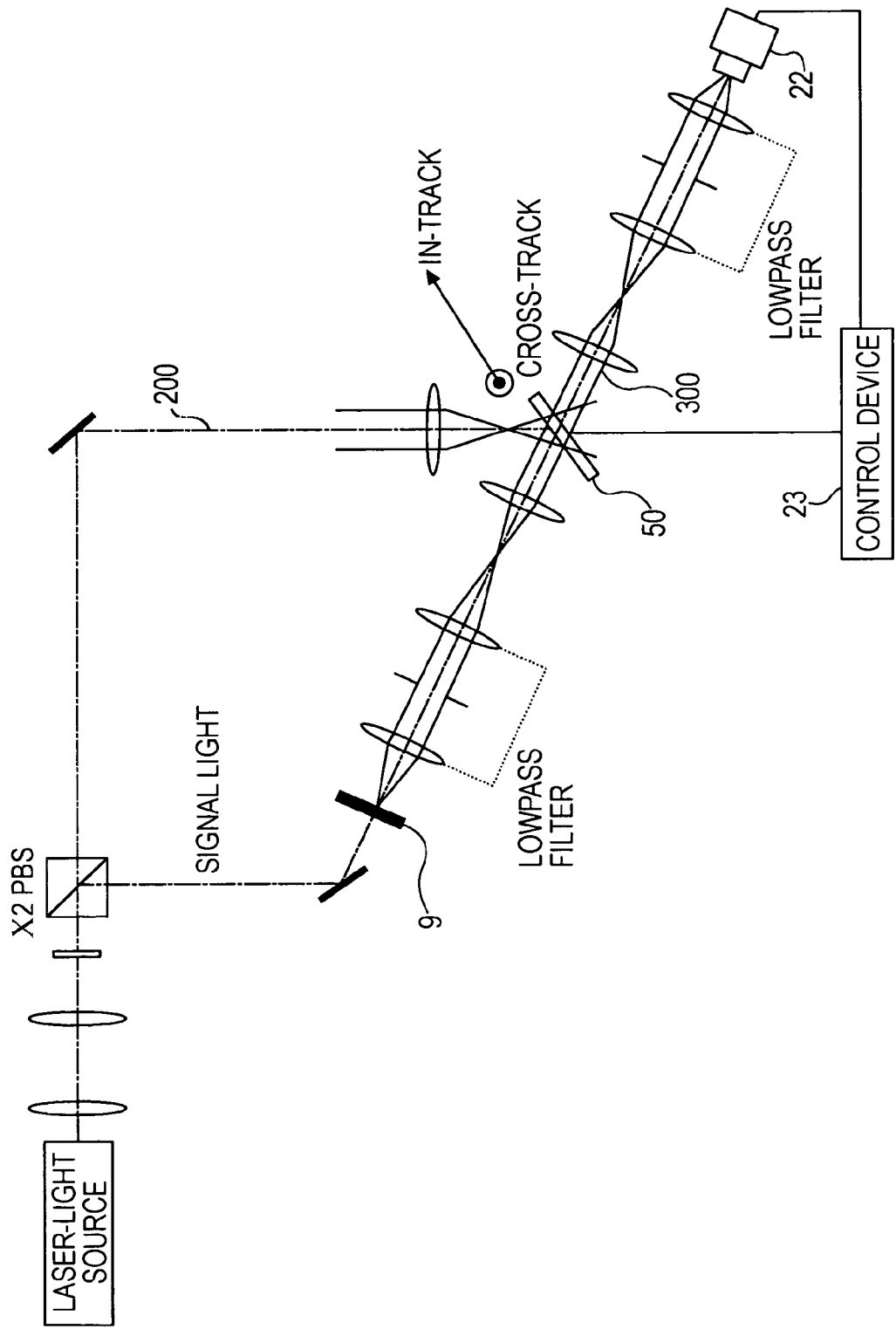
FIG. 17 shows an example configuration of a hologram-reproducing device operated according to a shift-multiplexing method.

Without being limited to the above-described embodiments, each of the above-described configurations, functions, operations, and advantages may be modified in the scope of the appended claims or the equivalents thereof so that the modification is construed as another embodiment of the present invention. Further, it should be understood by those skilled in the art that various modifications, combinations, sub-combinations and alterations may occur depending on design requirements and other factors insofar as they are within the scope of the appended claims or the equivalents thereof. For example, in the third embodiment, the present invention is used for the hologram-reproducing device operated according to the angle-multiplexing method. However, the same advantages as those of the third embodiment can be achieved by using the present invention for a hologram-reproducing device shown in FIG. 17, the hologram-reproducing device being operated according to a shift-multiplexing method. In that case, the hologram-recording material 50 is moved little by little and irradiated with the reference-light beam 200 under the control of the control device 23. At that time, the image sensor 22 picks up the image of the reproduction signal-light beam 300 consecutively so that a plurality of reproduced images are obtained. The control device 23 performs the image processing for the plurality of reproduced images according to the same method as that of the first embodiment, so that a single high-quality reproduced image is obtained. Further, the same advantages as those of the third embodiment can be achieved by using the present invention for a hologram-reproducing device operated according to various types of multiplexing methods including a phase-multiplexing method, a speckle-multiplexing method, and so forth.

What is claimed is:

1. A hologram-reproducing method adapted to obtain a reproduced image by irradiating a hologram-recording material with a reference-light beam so that a reproduction signal-light beam is generated and picking up an image of the reproduction signal-light beam, the hologram-reproducing method comprising the steps of:

generating a plurality of reproduced images by irradiating the hologram-recording material with a plurality of reference-light beams including the step of obtaining a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and generating a single reproduced image by performing image processing for the plurality of reproduced images.

2. The hologram-reproducing method according to claim 1, wherein, the image processing is adapted to regenerate a single image by collecting at least one pixel of which brightness is at the maximum level from among pixels of the generated reproduced images.

3. The hologram-reproducing method according to claim 2, further comprising the step of performing smoothing processing for the pixels corresponding to a plurality of consecutive hologram-reproduction images, as preprocessing performed before making a search for the maximum brightness level.

4. The hologram-reproducing method according to claim 1, wherein the image processing is adapted to regenerate the single image corresponding to at least one crosstalk component which occurs between holograms by collecting at least one pixel of which brightness is at the minimum level from among pixels of the generated reproduced images.

5. The hologram-reproducing method according to claim 4, further comprising the step of removing at least one crosstalk component which occurs from an image adjacent to an image regenerated by collecting at least one pixel of which brightness is at the maximum level from among pixels of the generated reproduced images by using the single image corresponding to the at least one crosstalk component which occurs between the holograms.

6. A hologram-reproducing method adapted to obtain a reproduced image by irradiating a hologram-recording material with a reference-light beam so that a reproduction signal-light beam is generated and picking up an image of the reproduction signal-light beam, the hologram-reproducing method comprising the steps of:

generating a plurality of reproduced images by irradiating the hologram-recording material with a plurality of reference-light beams, where the plurality of reference-light beams is made incident on the hologram-recording material at an angle of at least one of equivalent to and different from an angle at which a reference-light beam used for data recording is made incident on the hologram-recording material and including the step of obtaining a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and generating a single reproduced image by performing image processing for the plurality of reproduced images.

7. The hologram-reproducing method according to claim 6, further comprising the steps of:

generating a reproduction signal-light beam by irradiating the hologram-recording material with a reference-light beam which is continuously changed in a predetermined angle area so that the continuously changed reference-light beam is made incident on the hologram-recording material at an angle at least one of equivalent to and different from the angle at which the reference-light beam used for the data recording is made incident on the hologram-recording material; and generating a sequence of consecutive reproduced images by picking up an image of the reproduction signal-light beam consecutively.

8. A hologram-reproducing method adapted to obtain a reproduced image by irradiating a hologram-recording material with a reference-light beam so that a reproduction signal-light beam is generated and picking up an image of the reproduction signal-light beam, the hologram-reproducing method comprising the steps of:

generating a plurality of reproduced images by irradiating the hologram-recording material with a plurality of reference light beams, wherein a relationship between the plurality of reference light beams and a reproduction-target recording area of the hologram-recording material is at least one of equivalent to and different from a relationship between a reference light beam used for data recording and the reproduction-target recording area and including the step of obtaining a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and generating a single reproduced image by performing image processing for the plurality of reproduced images.

9. The hologram-reproducing method according to claim 8, further comprising the steps of:

irradiating the hologram-recording material with a reference-light beam continuously changed in a predetermined area, wherein a relationship between the continuously-changed reference light beam and the reproduction-target recording area is at least one of equivalent to and different from the relationship between the reference light beam used for the data recording and the reproduction-target recording area, so that the reproduction signal-light beam is generated; and generating a sequence of consecutive reproduced images by picking up an image of the reproduction signal-light beam consecutively.

10. The hologram-reproducing method according to claim 9, further comprising the step of merging a plurality of first images, where each of the first images is generated for each of a plurality of regions of a second image so that a single hologram image is generated, wherein each of the plurality of regions includes an image area used for performing image processing adapted to generate the sequence of consecutive reproduced images by picking up the image of the reproduction signal-light beam consecutively.

11. A hologram-reproducing device configured to obtain a reproduced image by irradiating a hologram-recording material with a reference-light beam so that a reproduction signal-light beam is generated and picking up an image of the reproduction signal-light beam, the hologram-reproducing device comprising:

reproduction means which generates a plurality of reproduced images by irradiating the hologram-recording material with a plurality of reference-light beams and which obtains a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and image-processing means which generates a single reproduced image by performing image processing for the plurality of reproduced images.

12. A hologram-reproducing device configured to obtain a reproduced image by irradiating a hologram-recording material with a reference-light beam so that a reproduction signal-light beam is generated and picking up an image of the reproduction signal-light beam, the hologram-reproducing device comprising:

reproduction means which generates a plurality of reproduced images by irradiating the hologram-recording material with a plurality of reference-light beams, where the plurality of reference-light beams is made incident on the hologram-recording material at an angle at least one of equivalent to and different from an angle at which a reference-light beam used for data recording is made incident on the hologram-recording material and which obtains a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and image-processing means which generates a single reproduced image by performing image processing for the plurality of reproduced images.

13. A hologram-reproducing device configured to obtain a reproduced image by irradiating a hologram-recording material with a reference-light beam so that a reproduction signal-light beam is generated and picking up an image of the reproduction signal-light beam, the hologram-reproducing device comprising:

reproduction means which generates a plurality of reproduced images by irradiating the hologram-recording material with a plurality of reference light beams, wherein a relationship between the plurality of reference light beams and a reproduction-target recording area of the hologram-recording material is at least one of equivalent to and different from a relationship between a reference light beam used for data recording and the reproduction-target recording area and which obtains a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and image-processing means which generates a single reproduced image by performing image processing for the plurality of reproduced images.

14. A hologram-reproducing device configured to obtain a reproduced image by irradiating a hologram-recording material with a reference-light beam so that a reproduction signal-light beam is generated and picking up an image of the reproduction signal-light beam, the hologram-reproducing device comprising:

a reproduction unit which generates a plurality of reproduced images by irradiating the hologram-recording material with a plurality of reference-light beams and which obtains a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and an image-processing unit which generates a single reproduced image by performing image processing for the plurality of reproduced images.

15. A hologram-reproducing device configured to obtain a reproduced image by irradiating a hologram-recording material with a reference-light beam so that a reproduction signal-light beam is generated and picking up an image of the reproduction signal-light beam, the hologram-reproducing device comprising:

a reproduction unit which generates a plurality of reproduced images by irradiating the hologram-recording material with a plurality of reference-light beams, where the plurality of reference-light beams is made incident on the hologram-recording material at an angle at least one of equivalent to and different from an angle at which a reference-light beam used for data recording is made incident on the hologram-recording material, and which obtains a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and an image-processing unit which generates a single reproduced image by performing image processing for the plurality of reproduced images.

16. A hologram-reproducing device configured to obtain a reproduced image by irradiating a hologram-recording material with a reference-light beam so that a reproduction signal-light beam is generated and picking up an image of the reproduction signal-light beam, the hologram-reproducing device comprising:

a reproduction unit which generates a plurality of reproduced images by irradiating the hologram-recording material with a plurality of reference light beams, wherein a relationship between the plurality of reference light beams and a reproduction-target recording area of the hologram-recording material is at least one of equivalent to and different from a relationship between a reference light beam used for data recording and the reproduction-target recording area and which obtains a predetermined area of an image, the predetermined area being used for performing image processing adapted to generate a sequence of consecutive reproduced images by picking up the image of the reproduction signal-light beam consecutively on the basis of a time-varying total of brightness values corresponding to at least one region of the image; and an image-processing unit which generates a single reproduced image by performing image processing for the plurality of reproduced images.

* * * * *

UNITED STATES PATENT AND TRADEMARK OFFICE
CERTIFICATE OF CORRECTION

PATENT NO. : 7,619,794 B2  Page 1 of 1
APPLICATION NO. : 11/430413
DATED : November 17, 2009
INVENTOR(S) : Shigeyuki Baba It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 531 days.

Signed and Sealed this

Twenty-sixth Day of October, 2010

David J. Kappos
*Director of the United States Patent and Trademark Office*